United States Patent [19]

King

[11] 4,261,762
[45] Apr. 14, 1981

[54] METHOD FOR CONDUCTING HEAT TO OR FROM AN ARTICLE BEING TREATED UNDER VACUUM

[75] Inventor: Monroe L. King, Austin, Tex.

[73] Assignee: Eaton Corporation, Cleveland, Ohio

[21] Appl. No.: 75,401

[22] Filed: Sep. 14, 1979

[51] Int. Cl.³ .................... H01J 37/00; H01L 23/44
[52] U.S. Cl. .................................. 148/1.5; 118/50;
 118/728; 165/104 R; 250/398; 250/492 A;
 357/91; 427/38
[58] Field of Search ............... 148/1.5; 357/91;
 250/398, 492 A; 118/50, 724, 725, 728; 427/38,
 39; 165/104 R

[56] References Cited

U.S. PATENT DOCUMENTS

| | | | |
|---|---|---|---|
| 3,351,731 | 11/1967 | Tanaka | 219/69 |
| 3,624,391 | 11/1971 | Davison | 250/49.5 TE |
| 3,818,982 | 6/1974 | Wagner | 165/86 |
| 3,993,123 | 11/1976 | Chu et al. | 165/80 |
| 4,067,042 | 1/1978 | Novak et al. | 357/82 |
| 4,118,630 | 10/1978 | McKenna et al. | 250/492 A |
| 4,155,011 | 5/1979 | Mark | 250/492 A |
| 4,162,401 | 7/1979 | King et al. | 250/311 |

OTHER PUBLICATIONS

Asselman et al., "Heat Pipes," Philips Tech. Rev. 33 (1973), 104–113.

Primary Examiner—L. DeWayne Rutledge
Assistant Examiner—Upendra Roy
Attorney, Agent, or Firm—R. J. McCloskey; F. M. Sajovec, Jr.

[57] ABSTRACT

A method and apparatus are disclosed for providing heat conduction between an article being treated in a vacuum and a support member by providing a gas under pressure of about 0.5 to 2.0 Torr between the article and the support member. The method and apparatus are described for use in a semiconductor wafer ion implantation system wherein the wafer is clamped to the support member which is cooled. A seal can be provided between the wafer and the support member adjacent the periphery of the article.

6 Claims, 6 Drawing Figures

FIG.4
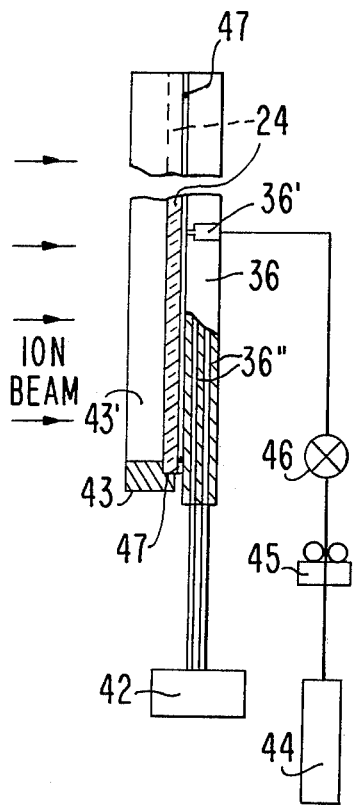
FIG. 5
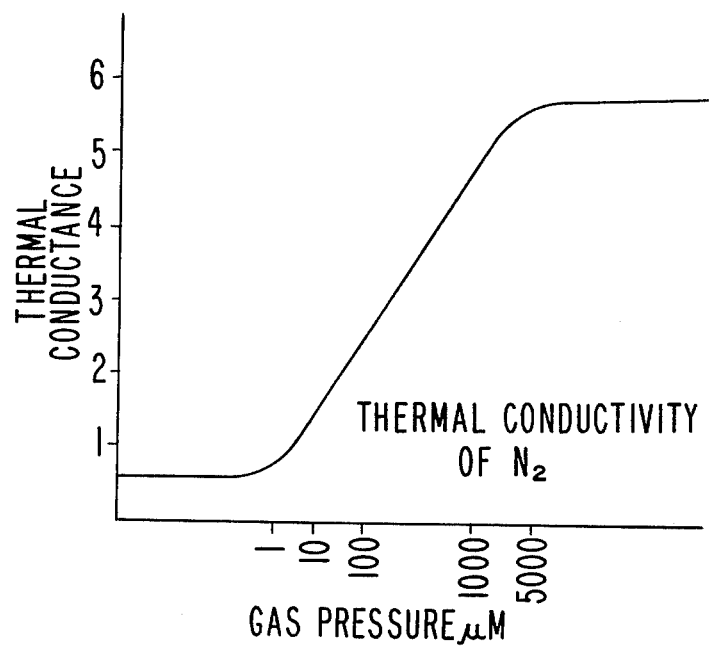
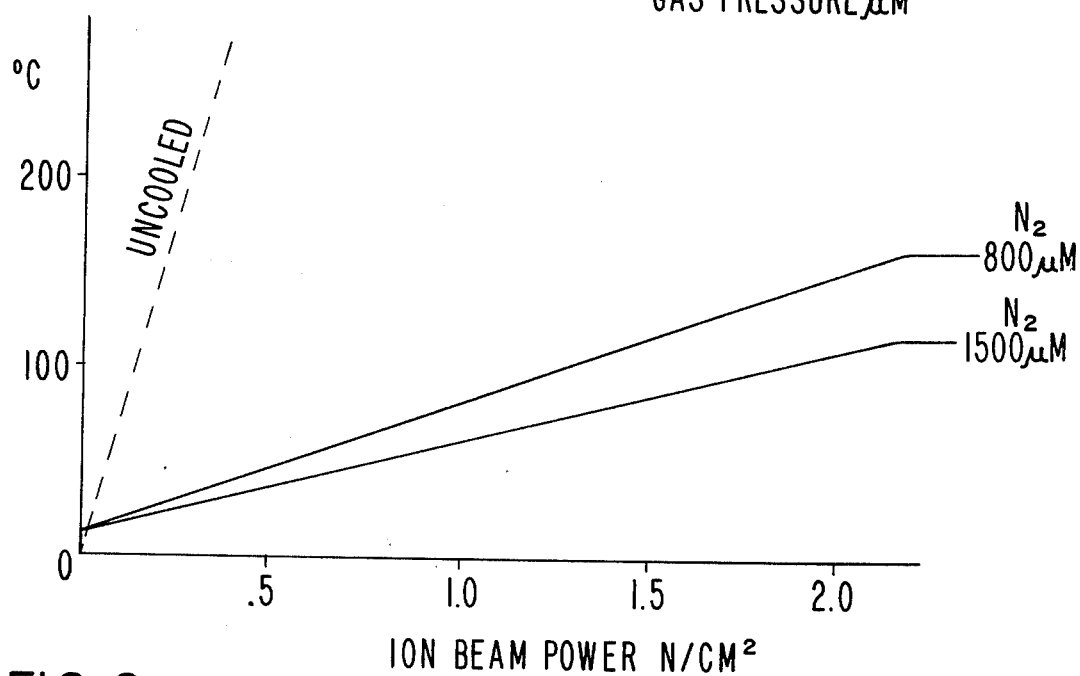
FIG. 6

METHOD FOR CONDUCTING HEAT TO OR FROM AN ARTICLE BEING TREATED UNDER VACUUM

BACKGROUND OF THE INVENTION

In many applications where articles are treated within a vacuum chamber it is desirable to control the temperature of the article. One such application is ion implantation of semiconductor wafers wherein a high energy ion beam is directed onto a semiconductor wafer which also results in heating of the wafer. Heating of the wafer in any ion implant process has a number of undesirable effects including damage to the photoresist layer which can out gas and shrink thereby destroying the desired precise pattern intended on the wafer by use of the photoresist. Early implantation systems relied upon heat removal from the silicon wafer by radiation effect only. Absence of gas molecules in the vacuum system such as typically $7 \times 10^{-7}$ Torr virtually eliminates conductive paths for heat flow. As beam powers in ion implantation systems have increased radiation cooling alone was no longer sufficient, and there have been attempts to make intimate contact with the silicon wafer for increased conduction. One method that has been attempted is the use of a thermally conductive conformat (soft pliable material) pressed mechanically to the back of the silicon slice hopefully to establish as many point contacts between the wafer and conformat for conduction to a support member. Although significant temperature depression has been realized with the use of a conformat, problems of repeatability, thermal non-uniformity and expensive maintenance have been experienced.

SUMMARY OF THE INVENTION

The object of the present invention is a method and apparatus which will provide proper thermal conduction between an article and a support member in a vacuum environment and which will overcome the shortcomings of the prior techniques.

Briefly stated, the invention to be described in greater detail below is directed to method and apparatus for conducting heat between an article being treated and a mounting member. In accordance with the present invention a gas under pressure is introduced between the article and the mounting member and provides sufficient conductivity to allow temperature control of the wafer.

Conductivity of a gas versus pressure is relatively flat from approximately 3,000 psi to 5/760 of an atmosphere at which level conductivity decays rapidly. Experimentation has shown that gas between a silicon wafer and a flat plate in the pressure range of about 0.5 to 2 Torr has a very low diffusion rate into the void of the vacuum system while at the same time providing sufficient thermal conductivity to maintain the temperature of the wafer at appropriate levels.

In accordance with another aspect of the present invention the wafer is clamped against the support member which both limits the excess flow of gas as well as produces a small path length for thermal conduction.

In accordance with another aspect of the present invention a seal can be provided between the wafer and the support member adjacent the periphery of the wafer thereby further limiting the escape of the gas into the vacuum chamber.

Other features and advantages of the present invention will become more apparent upon a perusal of the following specification taken in conjunction with the accompanying drawings wherein similar characters of reference refer to similar structural elements in each of the several views.

DESCRIPTION OF THE DRAWINGS

FIG. 4 is a schematic elevational view, partially broken away, illustrating a portion of the structure shown in FIG. 3.

FIG. 5 is a graph showing thermal conductance plotted versus gas pressure for nitrogen gas.

FIG. 6 is a graph of temperature plotted versus ion beam power showing for the temperature of a silicon wafer in an ion implantation system both for an uncooled wafer and a wafer cooled in accordance with the present invention with nitrogen gas at two different pressure levels.

DESCRIPTION OF THE PREFERRED EMBODIMENTS

While the present invention is applicable to provide thermal conductivity for controlling the temperature of an article in a vacuum for numerous possible applications, it is especially applicable for cooling a semiconductor wafer in an ion implantation system. Accordingly the invention will be described below with respect to such an ion implantation system.

Figure 1:
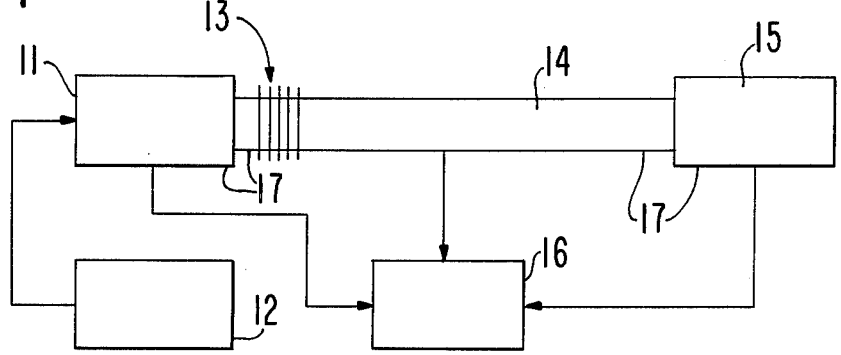
FIG. 1 is a schematic block diagram illustrating one application of the present invention.
Figure 2:
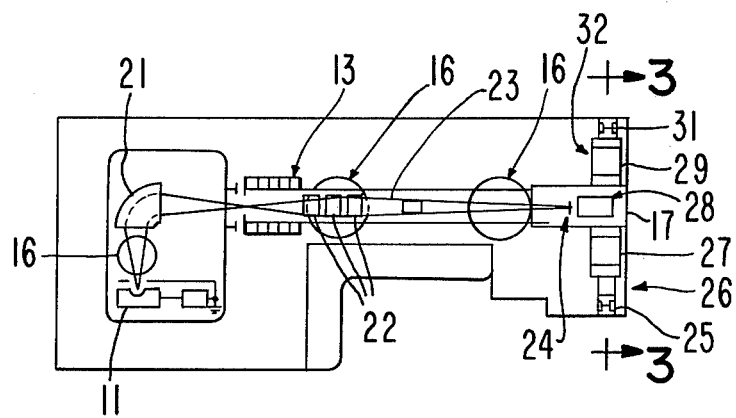
FIG. 2 is a schematic plan view of an ion implantation system incorporating the present invention.

Referring now to the drawings particularly with reference to FIGS. 1 and 2 there is schematically illustrated an ion implantation system wherein ions from a source 11 connected to a high voltage power supply 12 are generated for projection through an accelerator column 13 along a beam line 14 to an end station 15 wherein the ions are directed against a semiconductor wafer. The source 11, column 13, beam line 14, and end station 15 contained within a vacuum envelope 17 are maintained under high vacuum by vacuum pumping devices 16. The ion implantation system is typically operated at about the level $7 \times 10^{-7}$ Torr when the ion beam is directed against the wafer.

FIG. 2 better illustrates the elements of the ion implantation system. Ions from the source 11 are redirected by an analysing magnet 21 before being directed through the accelerator column 13 and after which pass through a triplet quadruple lens 22 and scanners 23. At the end station 15 wafers 24 from an imput cassette 25 are directed to an inlet station 26 through a vacuum lock 27 and into the high vacuum chamber 17 to the treating station 28 where the wafer 24 is exposed to the ion beam. From the treating station the wafer passes through a vacuum lock 29 to an output cassette 31 at the outlet station 32.

Figure 3:
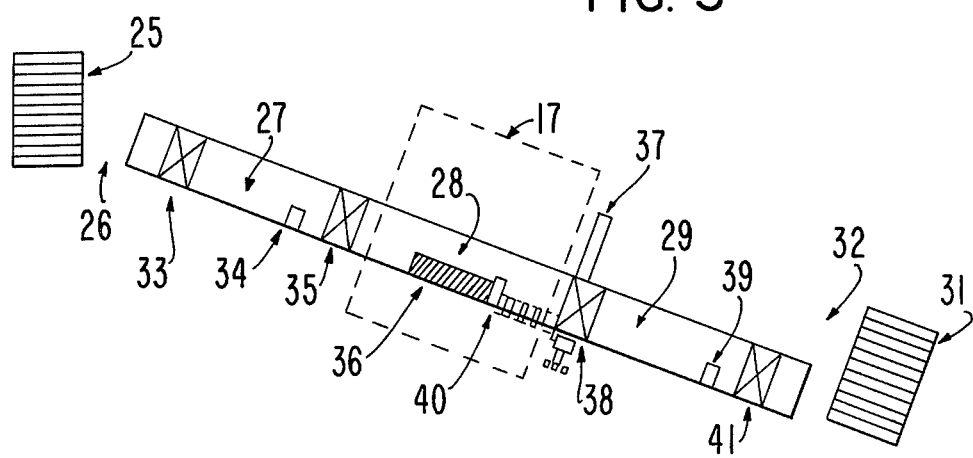
FIG. 3 is a schematic elevational sectional view of a portion of the structure shown in FIG. 2 taken along line 22 in the direction of the arrows.

FIG. 3 schematically illustrates the structure and movement of the wafer from the input cassette 25 to the output cassette 31. As shown in FIG. 3 the wafer from cassette 25 passes through a first gate valve 33 to a wafer stop 34 at which time the gate valve 33 is closed and the vacuum lock 27 reduced to an intermediate vacuum pressure. Then a second gate valve 35 is opened and the wafer fed by gravity onto a target block or support plate or member 36 at a stop 40 at the treating station 28. Typically, the wafer is clamped to the target block 36 which is then tilted by a swing arm 37 for application of the appropriate ion dosage. The target block 36 is then swung down so that the wafer is released from the clamp and moves by gravity on through the third open gate valve 38 to a stop 39 in vacuum lock 29. Gate valve 38 is then closed and a fourth gate valve 41 opened whereby the wafer is fed by gravity to the output cassette 31.

FIG. 4 schematically illustrates the positioning and clamping of the wafer 24 on the target block 36 which may be cooled via a cooling system such as freon circulated through internal passageways 36″ from a coolant recirculation system 42. The wafer 24 is clamped to the target block 36 by a clamp 43 that is centrally apertured at 43′ to pass the ion beam and that engages the wafer 24 adjacent its periphery.

Gas under pressure of about 0.5 to 2.0 Torr is fed through a channel 36′ to the interface between the wafer 24 and the target block 36 and provides the thermal conductivity for transferring heat from the wafer to the cooled target block. A gas with a high thermal conductivity such as, nitrogen, neon, helium or hydrogen (which are arranged in ascending order of conductivity at 360° K.) is directed from a source 44 through a regulator 45 and leak valve 46 to the channel 36′. It has been found that an opening at the end of the channel 36′ of approximately 10 to 20 thousandths inch diameter is sufficient to provide the appropriate gas for maintaining a 3″ wafer 24 at the desired temperature.

FIG. 5 shows a graph of thermal conductance plotted versus gas pressure for nitrogen. It will be seen that the thermal conductivity remains high to approximately 5 Torr where it begins to fall off dramatically. Use of gas in the range of 0.5 to 2.0 Torr provides the appropriate thermal conductivity for conducting heat away from the wafer. FIG. 6 shows a graph plotting temperature of a wafer against ion beam power and shows the effectiveness of the use of nitrogen gas at 0.8 Torr and 1.5 Torr.

While it has not been found necessary for successful utilization of the present invention, a seal can be provided between the wafer 24 and the target block 36 adjacent the periphery wafer 24 by an "O" ring 47.

It will be appreciated by those skilled in the art that selection of the particular operating gas and pressure will depend upon the efficiency and nature of the particular system operation.

Additionally it will be appreciated by those skilled in the art that this invention can be utilized for temperature control of wafers in other treating processes. A typical applicable process would be plasma etching of semiconductor wafers in a planer etching system, well known in the art and ion beam milling and electron beam annealing.

Other modifications and alternative configurations can be utilized in accordance with the present invention which is limited only by the scope of the appended claims.

I claim:

1. The method of treating an article in a vacuum chamber comprising the steps of positioning the article on a support plate at a treating station within said vacuum chamber and providing a gas under pressure between the article and the support plate to conduct heat between the article and the support plate.

2. The method of claim 1 including the step of clamping the article to the support plate over an orifice and directing the gas between the article and the support plate through said orifice.

3. The method of claim 1 including the step of sealing the article to the support plate adjacent the periphery of the article while the article is being treated.

4. The method of claim 1 wherein the gas is provided between the article and the support plate at a pressure of about 0.5 to 2.0 Torr.

5. The method of claim 1 wherein the said article is a semiconductor wafer and including the steps of directing an ion beam on the wafer at the treatment station for ion implantation into the wafer and wherein the wafer being treated is established in thermal contact with the support plate by the gas.

6. The method of claims 1 or 5 including the step of cooling the support plate whereby the wafer being treated is cooled by heat conduction from the wafer through the gas to the support plate being cooled.

* * * * *

Notice of Adverse Decision in Interference

In Interference No. 101,164, involving Patent No. 4,261,762, M. L. King, METHOD FOR CONDUCTING HEAT TO OR FROM AN ARTICLE BEING TREATED UNDER VACUUM, final judgment adverse to the patentee was rendered Sept. 27, 1985, as to claims 1-4 and 6.

[*Official Gazette November 26, 1985.*]